(12) United States Patent
Chang et al.

(10) Patent No.: US 9,520,304 B2
(45) Date of Patent: Dec. 13, 2016

(54) SEMICONDUCTOR PACKAGE AND FABRICATION METHOD THEREOF

(71) Applicant: Siliconware Precision Industries Co., Ltd., Taichung (TW)

(72) Inventors: Hong-Da Chang, Taichung (TW); Yi-Che Lai, Taichung (TW); Chi-Hsin Chiu, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/074,148

(22) Filed: Nov. 7, 2013

(65) Prior Publication Data
US 2015/0041969 A1 Feb. 12, 2015

(30) Foreign Application Priority Data
Aug. 12, 2013 (TW) .............................. 102128808 A

(51) Int. Cl.
*H01L 23/28* (2006.01)
*H01L 21/48* (2006.01)
(Continued)

(52) U.S. Cl.
CPC ....... *H01L 21/4857* (2013.01); *H01L 23/5383* (2013.01); *H01L 24/97* (2013.01); *H01L 21/561* (2013.01); *H01L 21/568* (2013.01); *H01L 23/3128* (2013.01); *H01L 2224/16225* (2013.01); *H01L 2224/32145* (2013.01); *H01L 2224/32225* (2013.01); *H01L 2224/73204* (2013.01); *H01L 2224/73253* (2013.01); *H01L 2224/81005* (2013.01); *H01L 2224/83005* (2013.01); *H01L 2224/92125* (2013.01); *H01L 2224/97* (2013.01);

(Continued)

(58) Field of Classification Search
CPC ...... H01L 23/28; H01L 21/56; H01L 21/4857; H01L 23/5383; H01L 24/09; H01L 2924/351; H01L 23/3128; H01L 2224/97; H01L 2224/92125; H01L 2224/81005; H01L 21/568; H01L 27/00; H01L 21/4825; H01L 21/563; H01L 23/49513
USPC 257/712, 737, 774, 782, 783, 787; 438/107, 118, 127, 109, 110, 112
See application file for complete search history.

(56) References Cited

U.S. PATENT DOCUMENTS

2004/0026789 A1* 2/2004 Michii ................ H01L 25/0657
257/777
2004/0164385 A1* 8/2004 Kado .................. H01L 23/3128
257/678

(Continued)

*Primary Examiner* — Jarrett Stark
*Assistant Examiner* — Shahed Ahmed
(74) *Attorney, Agent, or Firm* — Mintz Levin Cohn Ferris Glovsky and Popeo, P.C.; Peter F. Corless; Steven M. Jensen

(57) ABSTRACT

A fabrication method of a semiconductor package is disclosed, which includes the steps of: providing a semiconductor structure having a carrier, a circuit portion formed on the carrier and a plurality of semiconductor elements disposed on the circuit portion; disposing a lamination member on the semiconductor elements; forming an insulating layer on the circuit portion for encapsulating the semiconductor elements; and removing the carrier. The lamination member increases the strength between adjacent semiconductor elements so as to overcome the conventional cracking problem caused by a CTE mismatch between the semiconductor elements and the insulating layer when the carrier is removed.

34 Claims, 7 Drawing Sheets

(51) Int. Cl.
*H01L 23/00* (2006.01)
*H01L 23/538* (2006.01)
H01L 23/31 (2006.01)
H01L 21/56 (2006.01)

(52) U.S. Cl.
CPC *H01L 2924/15311* (2013.01); *H01L 2924/351* (2013.01)

(56) References Cited

U.S. PATENT DOCUMENTS

| | | | |
|---|---|---|---|
| 2009/0243086 A1* | 10/2009 | Warren | H01L 23/4334 257/712 |
| 2013/0075937 A1* | 3/2013 | Wang | H01L 25/0655 257/782 |
| 2014/0295618 A1* | 10/2014 | Kim | H01L 24/97 438/108 |

* cited by examiner

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 102128808, filed Aug. 12, 2013, the entire contents of which is incorporated herein by reference.

BACKGROUND OF THE INVENTION

1. Field of the Invention

The present invention relates to semiconductor packages and fabrication methods thereof, and more particularly, to a semiconductor package having wafer-level circuits and a fabrication method thereof.

2. Description of Related Art

Along with the rapid development of electronic industries, electronic products are developed toward multi-function and high electrical performance. Accordingly, there have been developed various types of flip-chip packaging modules such as chip scale packages (CSPs), direct chip attached (DCA) packages and multi-chip module (MCM), and 3D IC chip stacking technologies.

FIG. 1A is a schematic cross-sectional view of a conventional semiconductor package 1. Referring to FIG. 1A, the semiconductor package 1 has a packaging substrate 14 having a plurality of bonding pads 140 having a large pitch, a through silicon interposer (TSI) 10 disposed on the packaging substrate 14, and a semiconductor chip 12 disposed on the through silicon interposer 10 and having a plurality of electrode pads 120 having a small pitch. The through silicon interposer 10 has a plurality of through silicon vias (TSVs) 100 formed therein and a redistribution layer (RDL) structure 101 formed on the TSVs 100. The RDL structure 101 is electrically connected to the bonding pads 140 of the packaging substrate 14 through a plurality of conductive elements 18. An underfill 13 is formed between the through silicon interposer 10 and the packaging substrate 14 for encapsulating the conductive elements 18. The electrode pads 120 of the semiconductor chip 120 are electrically connected to the TSVs 100 of the through silicon interposer 10 through a plurality of solder bumps 121. Further, an underfill 13 is formed between the through silicon interposer 10 and the semiconductor chip 120 for encapsulating the solder bumps 121.

If the semiconductor chip 12 is directly disposed on the packaging substrate 14, joints formed between the solder bumps 121 of the semiconductor chip 12 and the bonding pads 140 of the packaging substrate 14 can be adversely affected by a big CTE (Coefficient of Thermal Expansion) mismatch between the semiconductor chip 12 and the packaging substrate 14, thus easily resulting in delamination of the solder bumps 121 from the packaging substrate 14. Further, the CTE mismatch between the semiconductor chip 12 and the packaging substrate 14 induces more thermal stresses and leads to more serious warpages, thereby reducing the reliability of electrical connection between the semiconductor chip 12 and the packaging substrate 14 and even resulting in failure of a reliability test.

Therefore, the through silicon interposer 10 made of a semiconductor material close to the semiconductor chip 12 is provided so as to effectively overcome the above-described drawbacks.

However, to form the TSVs 100 of the through silicon interposer 10, a plurality of through holes need to be formed in the through silicon interposer 10 and filled with a metal material, which incurs a high cost. For example, for a 12-inch wafer, the TSV cost occupies about 40% to 50% of the total cost for fabricating the through silicon interposer 10. Consequently, the cost of the final product is increased.

Further, the fabrication of the through silicon interposer 10 is quite complicated, thus resulting in a low yield of the semiconductor package 1.

To overcome the above-described drawbacks, a semiconductor package 1' without a through silicon interposer, as shown in FIG. 1B, is proposed. Referring to FIG. 1B, a plurality of semiconductor chips 12 are disposed on a circuit portion 11 on a carrier (not shown) through a plurality of solder bumps 121. Then, an encapsulant 16 is formed on the circuit portion 11 for encapsulating the semiconductor chips 12 so as to protect the semiconductor chips 12 and increase the rigidity of the semiconductor package 1'. Thereafter, the carrier (not shown) on the lower side of the circuit portion 11 is removed and an insulating layer 17 is formed on the lower side of the circuit portion 11. The circuit portion 11 is partially exposed from the insulating layer 17 so as for a plurality of conductive elements 18 such as solder balls to be formed thereon.

However, since the gap between the semiconductor chips 12 is very small, when the carrier on the lower side of the circuit portion 11 is removed, stresses induced by a CTE mismatch between the semiconductor chips 12, inter-metal dielectric (IMD) layers of the circuit portion 11 and the encapsulant 16 can easily cause cracking of the IMD layers of the circuit portion 11 and even cause cracking of the solder bumps 121, for example, a crack k of FIG. 1B.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a circuit portion having opposite first and second sides; a plurality of semiconductor elements disposed on the first side of the circuit portion; a lamination member disposed on the semiconductor elements; and an insulating layer formed on the first side of the circuit portion for encapsulating the semiconductor elements.

In the above-described package, the insulating layer can further encapsulate the lamination member. Furthermore, the lamination member can be exposed from a surface of the insulating layer.

In the above-described package, the insulating layer can be flush on sides with the lamination member.

The above-described package can further comprise an adhesive layer formed between the semiconductor elements and the lamination member. The adhesive layer can further be formed between the insulating layer and the lamination member. The adhesive layer can be made of a die attach film (DAF) or a thermal interface material (TIM).

In the above-described package, the insulating layer can further be formed between the lamination member and the semiconductor elements.

The above-described package can further comprise a plurality of conductive elements formed on the second side of the circuit portion.

The present invention further provides a fabrication method of a semiconductor package, which comprises the steps of: providing a semiconductor structure comprising a carrier, a circuit portion formed on the carrier and a plurality of semiconductor elements disposed on the circuit portion; disposing a lamination member on the semiconductor elements; forming an insulating layer on the circuit portion for encapsulating the semiconductor elements; and removing the carrier.

In the above-described method, the insulating layer can further encapsulate the lamination member. After forming the insulating layer, the method can further comprise exposing the lamination member from a surface of the insulating layer.

In the above-described method, the lamination member can be disposed on the semiconductor elements through an adhesive layer. The adhesive layer can be made of a die attach film (DAF) or a thermal interface material (TIM).

In the above-described method, the carrier can be a silicon-containing substrate.

After the carrier is removed, the above-described method can further comprise exposing the circuit portion so as to form a plurality of conductive elements on the circuit portion.

The present invention provides another fabrication method of a semiconductor package, which comprises the steps of: providing a semiconductor structure comprising a carrier, a circuit portion formed on the carrier and a plurality of semiconductor elements disposed on the circuit portion; forming an insulating layer on the circuit portion for encapsulating the semiconductor elements; disposing a lamination member on the semiconductor elements and the insulating layer; and removing the carrier.

In the above-described method, the lamination member can be disposed on the semiconductor elements and the insulating layer through an adhesive layer. The adhesive layer can be made of a die attach film (DAF) or a thermal interface material (TIM).

In the above-described method, the carrier can be a silicon-containing substrate.

After the carrier is removed, the above-described method can further comprise exposing the circuit portion so as to form a plurality of conductive elements on the circuit portion.

The present invention still provides another fabrication method of a semiconductor package, which comprises the steps of: providing a semiconductor structure comprising a carrier, a circuit portion formed on the carrier and a plurality of semiconductor elements disposed on the circuit portion; providing a lamination member having an insulating layer and disposing the lamination member on the circuit portion through the insulating layer, wherein the insulating layer encapsulates the semiconductor elements; and removing the carrier.

In the above-described method, the insulating layer can further be formed between the lamination member and the semiconductor elements.

In the above-described method, the carrier can be a silicon-containing substrate.

After the carrier is removed, the above-described method can further comprise exposing the circuit portion so as to form a plurality of conductive elements on the circuit portion.

In the above-described package and methods, an underfill can further be formed between the circuit portion and the semiconductor elements.

In the above-described package and methods, the insulating layer can further be formed between the circuit portion and the semiconductor elements.

In the above-described package and methods, the lamination member can be a dummy die.

According to the present invention, a lamination member is provided to increase the strength between adjacent semiconductor elements. Therefore, the present invention overcomes the conventional cracking problem caused by a CTE mismatch between the semiconductor elements and the insulating layer when the carrier is removed.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2E are schematic cross-sectional views showing a fabrication method of a semiconductor package 2 according to a first embodiment of the present invention.

Figure 1A:
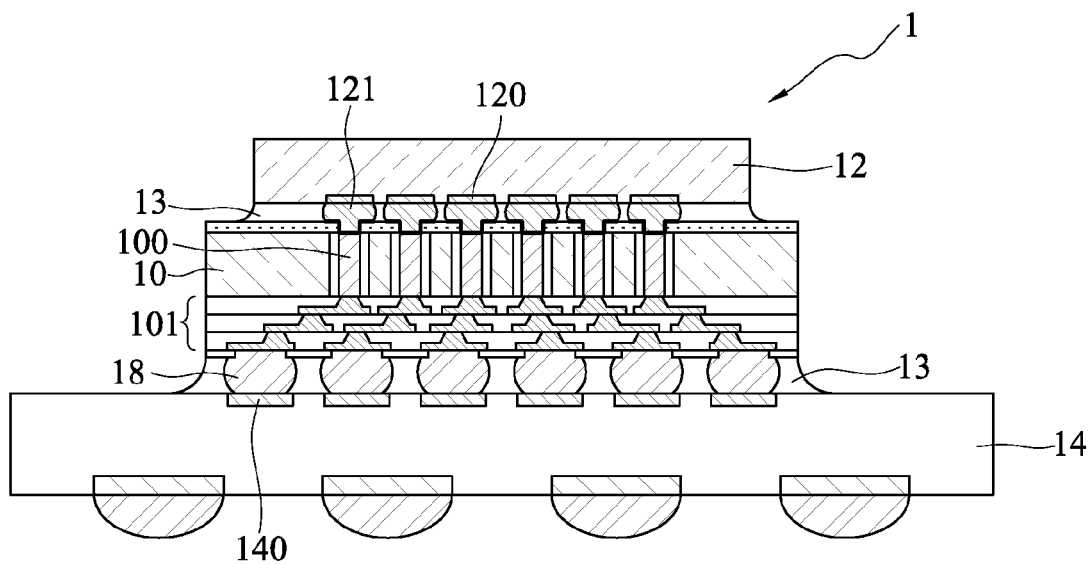
FIGS. 1A and 1B are schematic cross-sectional views of conventional semiconductor packages.
Figure 1B:
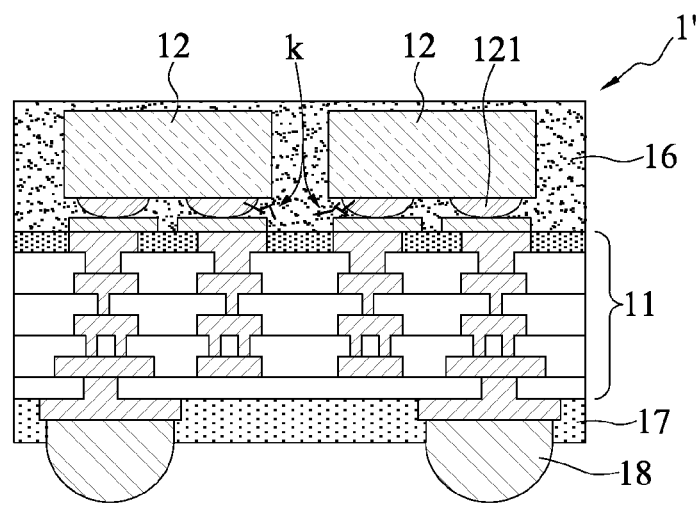
Figure 2A:
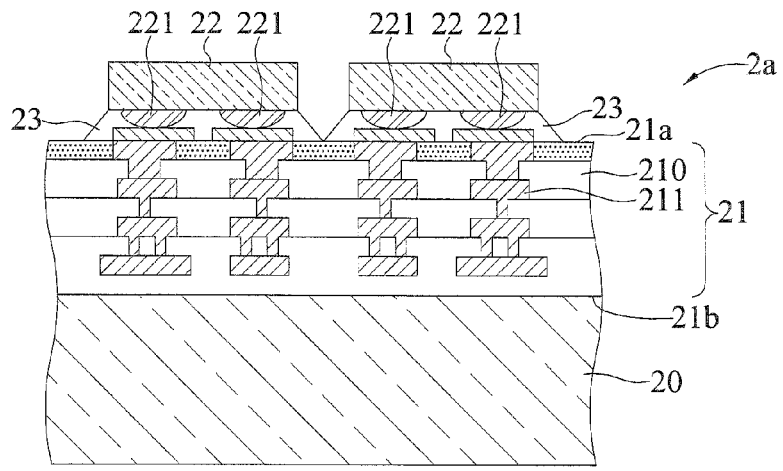
FIGS. 2A to 2E are schematic cross-sectional views showing a fabrication method of a semiconductor package according to a first embodiment of the present invention, wherein FIG. 2E' shows another embodiment of FIG. 2E.

Referring to FIG. 2A, a semiconductor structure 2a is provided, which has a carrier 20, a circuit portion 21 formed on the carrier 20, a plurality of semiconductor elements 22 disposed on the circuit portion 21, and an underfill 23 formed between the circuit portion 21 and the semiconductor elements 22.

In the present embodiment, the carrier 20 is a silicon-containing substrate.

The circuit portion 21 has a plurality of dielectric layers 210 and a plurality of circuit layers 211 alternately stacked on one another. Further, the circuit portion 21 has a first side 21a on which the semiconductor elements 22 are disposed and a second side 21b opposite to the first side 21a and bonded to the carrier 20.

Each of the semiconductor elements 22 is flip-chip bonded to the circuit layers 211 of the circuit portion 21 through a plurality of conductive bumps 221, and the underfill 23 encapsulates the conductive bumps 221.

The circuit layers 211 are wafer-level circuits instead of packaging-substrate-level circuits. Currently, packaging substrates have a minimum line width and pitch of 12 um, while semiconductor processes can provide a line width and pitch below 3 um.

Figure 2B:
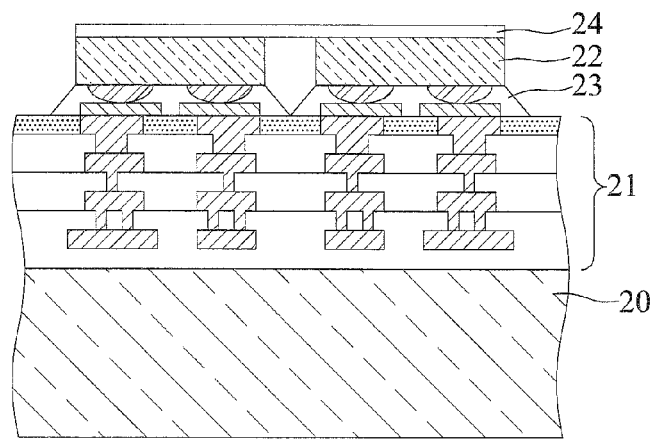

Referring to FIG. 2B, an adhesive layer 24 is formed on the semiconductor elements 22. In the present embodiment, the adhesive layer 24 is made of a die attach film (DAF) or a thermal interface material (TIM) such as a thermal adhesive.

Figure 2C:
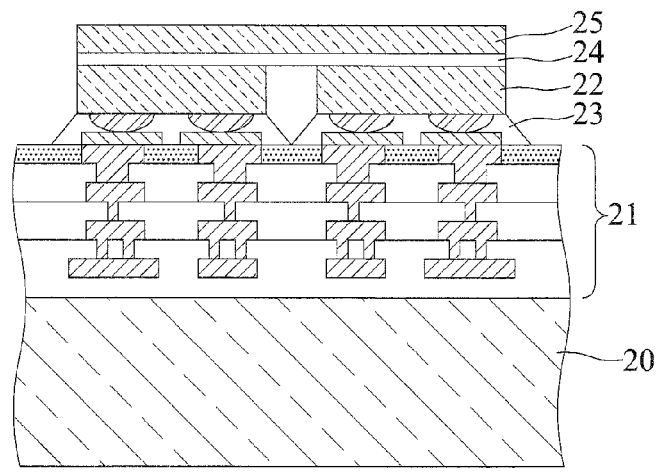

Referring to FIG. 2C, a lamination member 25 is disposed on the adhesive layer 24 to increase the strength between the semiconductor elements 22.

In the present embodiment, the lamination member 25 is a dummy die singulated from a wafer.

In another embodiment, the adhesive layer 24 is formed on the lamination member 25 first and then the lamination member 25 having the adhesive layer 24 is disposed on the semiconductor elements 22 through the adhesive layer 24.

Figure 2D:
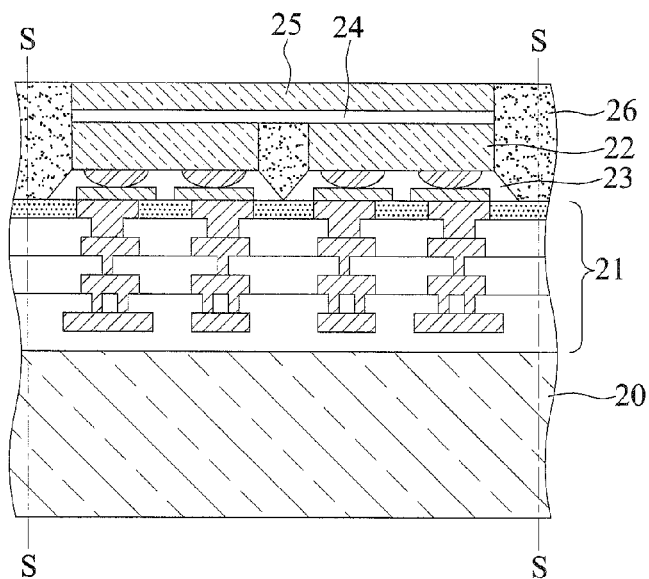

Referring to FIG. 2D, an insulating layer 26 is formed on the first side 21a of the circuit portion 21 for encapsulating the semiconductor elements 22.

In the present embodiment, the lamination member 25 is partially encapsulated by the insulating layer 26 and exposed from a surface of the insulating layer 26. In another embodiment, the lamination member 25 is entirely encapsulated by the insulating layer 26 and not exposed from the insulating layer 26.

The insulating layer 26 can be an encapsulant, a lamination film or a coating layer.

Figure 2E:
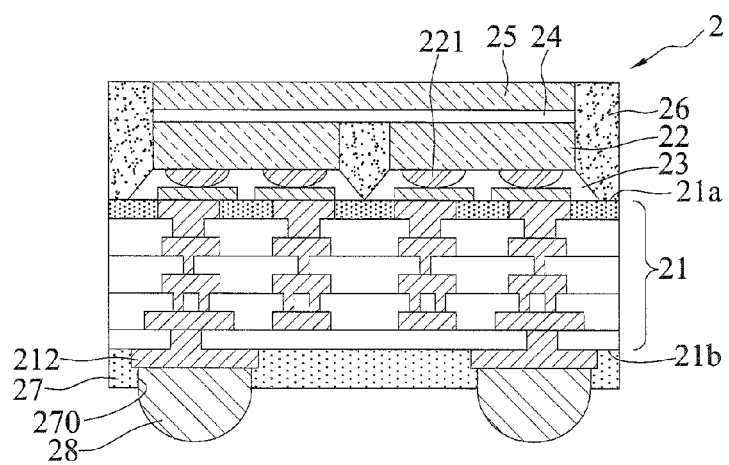
Figure 2E:
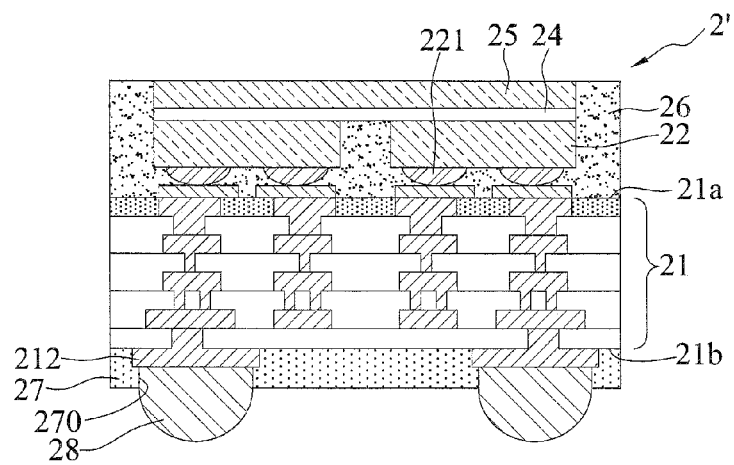

Referring to FIG. 2E, the carrier 20 is removed to expose the second side 21b of the circuit portion 21 and a plurality of conductive elements 28 are formed on the second side 21b of the circuit portion 21. Thereafter, a singulation process is performed along cutting paths S of FIG. 2D to obtain a plurality of semiconductor packages 2.

In the present embodiment, a plurality of conductive pads 212 electrically connected to the circuit layers 211 are formed on the second side 21b of the circuit portion 21 first and then an insulating layer 27 is formed on the second side 21b of the circuit portion 21. The insulating layer 27 has a plurality of openings 270 exposing the conductive pads 212 such that the conductive elements 28 such as solder balls are formed on the exposed conductive pads 212.

In another embodiment, the singulation process can be performed before formation of the conductive pads 212, the insulating layer 27 and the conductive elements 28.

In another embodiment, the underfill 23 can be omitted. Instead, the insulating layer 26 is formed between the circuit portion 21 and the semiconductor elements 22 for encapsulating the conductive bumps 221, as shown in FIG. 2E'.

FIGS. 3A to 3D are schematic cross-sectional views showing a fabrication method of a semiconductor package 3 according to a second embodiment of the present invention. Different from the first embodiment, the present embodiment forms the insulating layer before disposing the lamination member, which is detailed as follows.

Figure 3A:
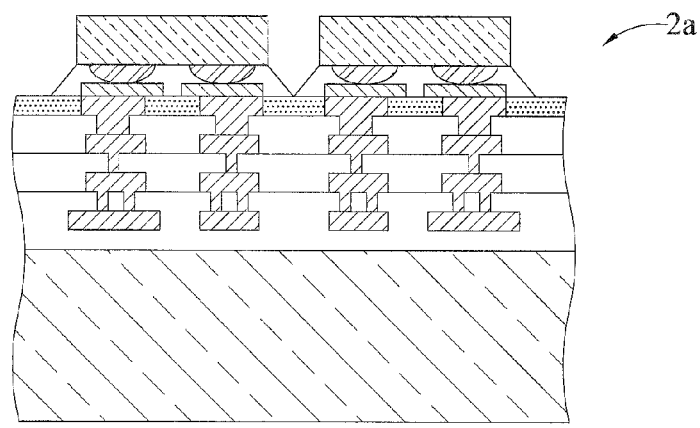
FIGS. 3A to 3D are schematic cross-sectional views showing a fabrication method of a semiconductor package according to a second embodiment the present invention, wherein FIG. 3D' shows another embodiment of FIG. 3D.

Referring to FIG. 3A, a semiconductor structure 2a of FIG. 2A is provided.

Figure 3B:
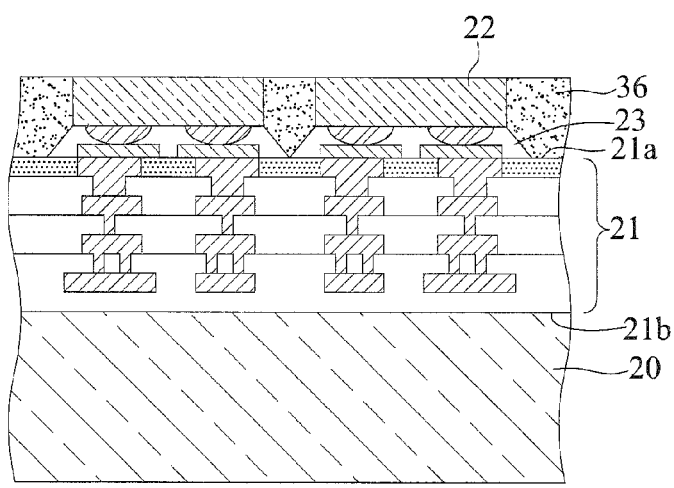

Referring to FIG. 3B, an insulating layer 36 is formed on the first side 21a of the circuit portion 21 for encapsulating the semiconductor elements 22. The semiconductor elements 22 are exposed from a surface of the insulating layer 36.

Figure 3C:
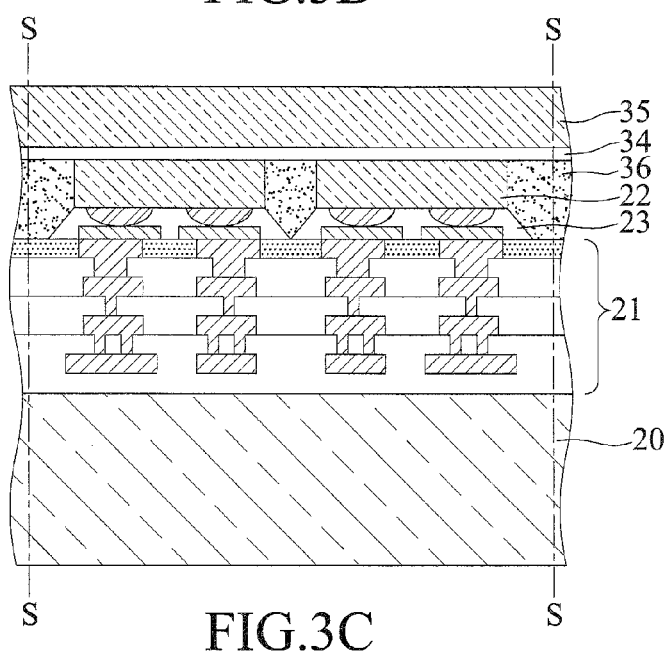

Referring to FIG. 3C, a lamination member 35 is disposed on the semiconductor elements 22 and the insulating layer 36.

In the present embodiment, the lamination member 35 is disposed on the semiconductor elements 22 and the insulating layer 36 through an adhesive layer 34.

The lamination member 35 is a non-singulated wafer-type dummy die.

Figure 3D:
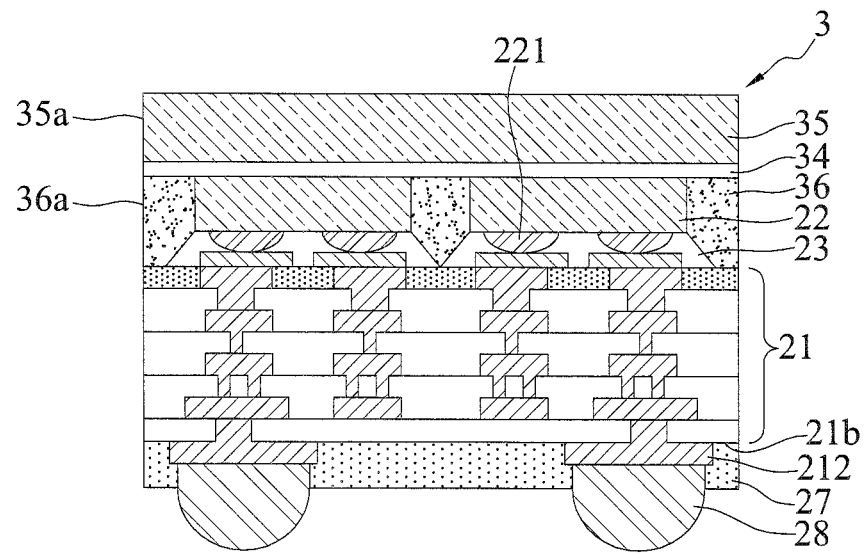
Figure 3D:
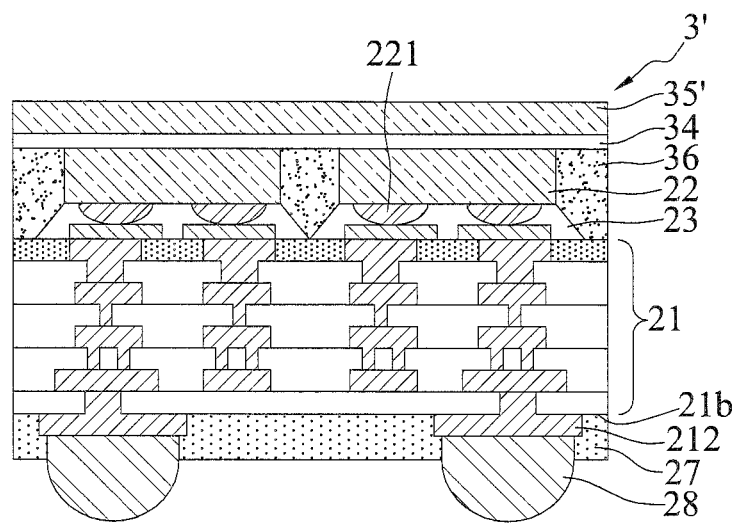

Referring to FIG. 3D, the carrier 20 is removed to expose the second side 21b of the circuit portion 21 and a plurality of conductive elements 28 are formed on the second side 21b of the circuit portion 21. Thereafter, a singulation process is performed along cutting paths S of FIG. 3C to obtain a plurality of semiconductor packages 3. Side surface 36a of the insulating layer 36 are flush with side surfaces 35a of the lamination member 35.

In another embodiment, referring to FIG. 3D', after forming the conductive elements 28 and before performing the simulation process, the lamination member 35 is thinned to form a lamination member 35' having a reduced thickness.

FIGS. 4A to 4D are schematic cross-sectional views showing a fabrication method of a semiconductor package 4 according to a third embodiment of the present invention. The present embodiment differs from the second embodiment in the bonding of the lamination member to the semiconductor elements, which is detailed as follows.

Figure 4A:
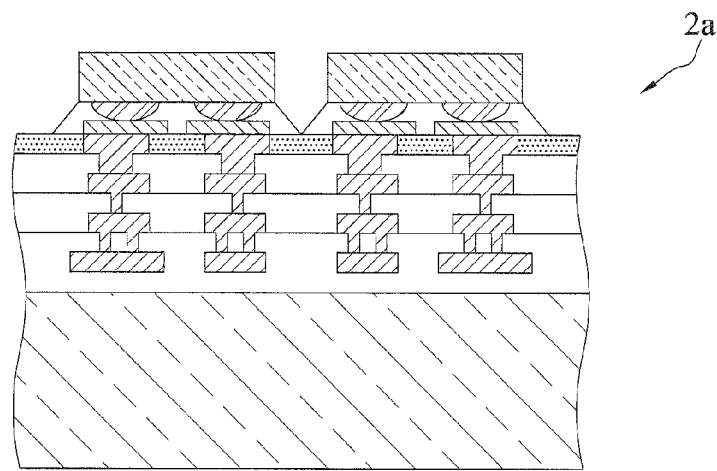
FIGS. 4A to 4D are schematic cross-sectional views showing a fabrication method of a semiconductor package according to a third embodiment the present invention, wherein FIG. 4D' shows another embodiment of FIG. 4D.

Referring to FIG. 4A, a semiconductor structure 2a of FIG. 2A is provided.

Figure 4B:
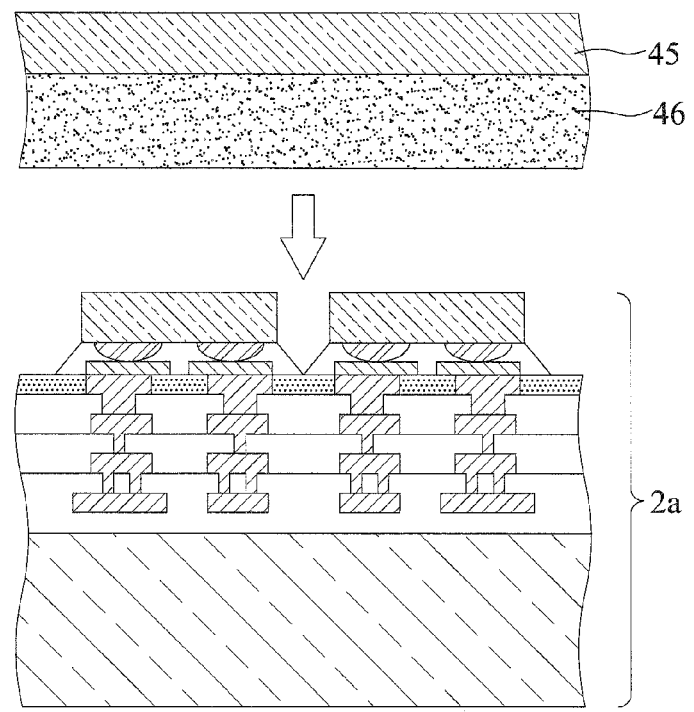

Referring to FIG. 4B, a lamination member 45 having an insulating layer 46 is provided. The lamination member 45 is a non-singulated wafer-type dummy die.

Figure 4C:
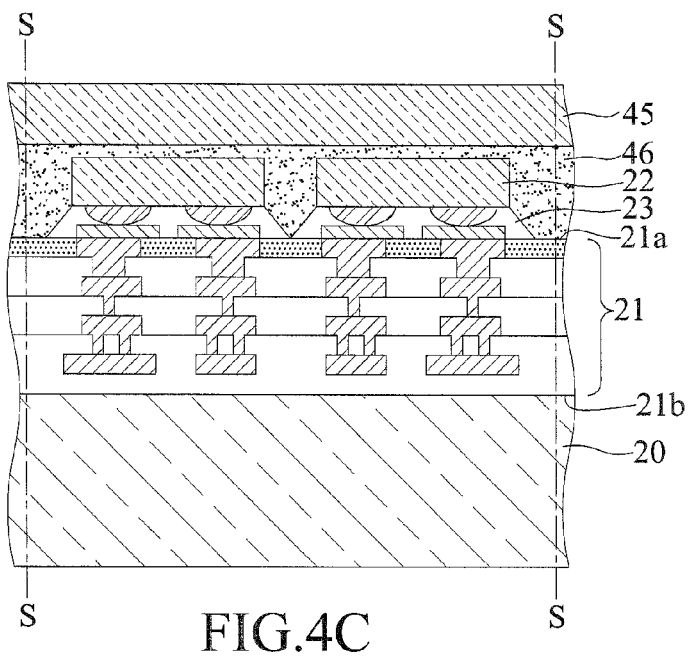

Referring to FIG. 4C, the lamination member 45 is disposed on the first side 21a of the circuit portion 21 through the insulating layer 46. The insulating layer 46 encapsulates the semiconductor elements 22.

In the present embodiment, the insulating layer 46 is formed between the lamination member 45 and the semiconductor elements 22 for bonding the lamination member 45 to the semiconductor elements 22.

Figure 4D:
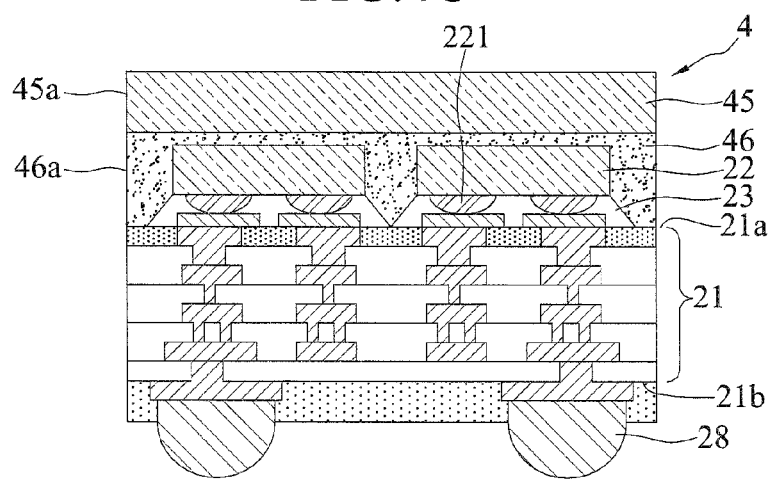
Figure 4D:
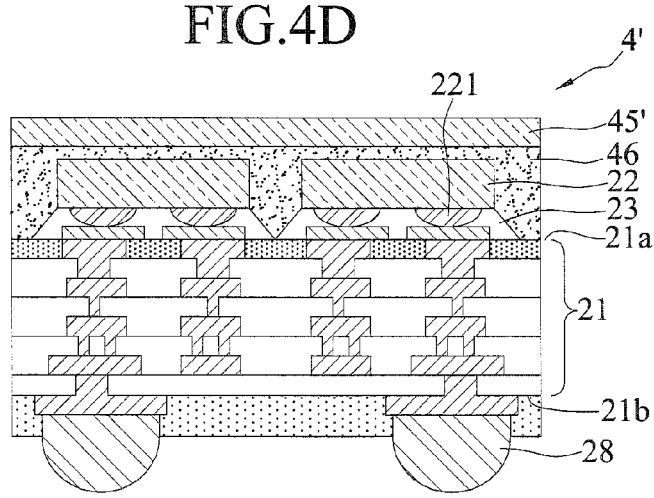

Referring to FIG. 4D, the carrier 20 is removed to expose the second side 21b of the circuit portion 21 and a plurality of conductive elements 28 are formed on the second side 21b of the circuit portion 21. Thereafter, a singulation process is performed along cutting paths S of FIG. 4C to obtain a plurality of semiconductor packages 4. Side surfaces 46a of the insulating layer 46 are flush with side surfaces 45a of the lamination member 45.

In another embodiment, referring to FIG. 4D', after forming the conductive elements 28 and before performing the singulation process, the lamination member 45 is thinned to form a lamination member 45' having a reduced thickness.

According to the present invention, a lamination member 25, 35, 35', 45, 45' is bonded to two adjacent semiconductor elements 22 so as to increase the strength between the adjacent semiconductor elements 22. Therefore, the present invention avoids cracking of the conductive bumps 221 and the dielectric layers 210 of the circuit portion 21 caused by a CTE mismatch between the semiconductor elements 22 and the insulating layer 26, 36, 46 when the carrier 20 is removed.

The present invention further provides a semiconductor package 2, 2', 3, 3', 4, 4', which has: a circuit portion 21 having opposite first and second sides 21a, 21b; a plurality of semiconductor elements 22 disposed on the first side 21a of the circuit portion 21; a lamination member 25, 35, 35', 45, 45' disposed on the semiconductor elements 22; and an insulating layer 26, 36, 46 formed on the first side 21a of the circuit portion 21 for encapsulating the semiconductor elements 22.

The lamination member 25, 35, 35', 45, 45' can be a dummy die.

In an embodiment, the insulating layer 26 further encapsulates the lamination member 25, and the lamination member 25 is exposed from a surface of the insulating layer 26.

Preferably, the semiconductor package 2 further has an underfill 23 formed between the first side 21a of the circuit portion 21 and the semiconductor elements 22. In another embodiment, the insulating layer 26 is filled between the first side 21a of the circuit portion 21 and the semiconductor elements 22.

In an embodiment, the semiconductor package 2, 2', 3, 3' further has an adhesive layer 24, 34 formed between the semiconductor elements 22 and the lamination member 25, 35, 35'. The adhesive layer 24, 34 can be made of a die attach film (DAF) or a thermal interface material (TIM). In an embodiment, the adhesive layer 34 is further formed between the insulating layer 36 and the lamination member 35, 35'.

In an embodiment, side surfaces 36a, 46a of the insulating layer 36, 46 are flush with side surfaces 35a, 45a of the lamination member 35, 45.

In an embodiment, the insulating layer 46 is further formed between the lamination member 45, 45' and the semiconductor elements 22.

In an embodiment, the semiconductor package 2, 2', 3, 3', 4, 4' further has a plurality of conductive elements 28 formed on the second side 21b of the circuit portion 21.

According to the present invention, a lamination member is bonded to two adjacent semiconductor elements to increase the strength between the adjacent semiconductor elements, thereby avoiding cracking of the conductive bumps of the semiconductor elements.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a circuit portion having opposite first and second sides;
   a plurality of semiconductor chips disposed on the first side of the circuit portion;
   a lamination member disposed on the semiconductor chips so as to increase a strength between the semiconductor chips, wherein the lamination member is a dummy die; and
   an insulating layer formed on the first side of the circuit portion for encapsulating the semiconductor chips.

2. The package of claim 1, wherein the insulating layer further encapsulates the lamination member.

3. The package of claim 2, wherein the lamination member is exposed from a surface of the insulating layer.

4. The package of claim 1, wherein the insulating layer is flush on sides with the lamination member.

5. The package of claim 1, further comprising an adhesive layer formed between the semiconductor chips and the lamination member.

6. The package of claim 5, wherein the adhesive layer is further formed between the insulating layer and the lamination member.

7. The package of claim 5, wherein the adhesive layer is made of a die attach film (DAF) or a thermal interface material (TIM).

8. The package of claim 1, wherein the insulating layer is further formed between the lamination member and the semiconductor chips.

9. The package of claim 1, further comprising a plurality of conductive elements formed on the second side of the circuit portion.

10. The package of claim 1, wherein the insulating layer is further formed between the circuit portion and the semiconductor chips.

11. The package of claim 1, further comprising an underfill formed between the circuit portion and the semiconductor chips.

12. A fabrication method of a semiconductor package, comprising the steps of:
    providing a semiconductor structure comprising a carrier, a circuit portion formed on the carrier and a plurality of semiconductor chips disposed on the circuit portion;
    disposing a lamination member on the semiconductor chips, wherein the lamination member is a dummy die;
    forming an insulating layer on the circuit portion for encapsulating the semiconductor chips; and
    removing the carrier.

13. The method of claim 12, wherein the carrier is a silicon-containing substrate.

14. The method of claim 12, wherein the semiconductor structure further comprises an underfill formed between the circuit portion and the semiconductor chips.

15. The method of claim 12, wherein the insulating layer is further formed between the circuit portion and the semiconductor chips.

16. The method of claim 12, wherein the lamination member is disposed on the semiconductor chips through an adhesive layer.

17. The method of claim 16, wherein the adhesive layer is made of a die attach film (DAF) or a thermal interface material (TIM).

18. The method of claim 12, wherein the insulating layer further encapsulates the lamination member.

19. The method of claim 18, after forming the insulating layer, further comprising exposing the lamination member from a surface of the insulating layer.

20. The method of claim 12, after removing the carrier, further comprising exposing the circuit portion so as to form a plurality of conductive elements on the circuit portion.

21. A fabrication method of a semiconductor package, comprising the steps of:
    providing a semiconductor structure comprising a carrier, a circuit portion formed on the carrier and a plurality of semiconductor chips disposed on the circuit portion;
    forming an insulating layer on the circuit portion for encapsulating the semiconductor chips;
    disposing a lamination member on the semiconductor chips and the insulating layer, wherein the lamination member is a dummy die; and
    removing the carrier.

22. The method of claim 21, wherein the carrier is a silicon-containing substrate.

23. The method of claim 21, wherein the semiconductor structure further comprises an underfill formed between the circuit portion and the semiconductor chips.

24. The method of claim 21, wherein the insulating layer is further formed between the circuit portion and the semiconductor chips.

25. The method of claim 21, before disposing the lamination member, further comprising exposing the semiconductor chips from a surface of the insulating layer.

26. The method of claim 25, wherein the lamination member is disposed on the semiconductor chips and the insulating layer through an adhesive layer.

27. The method of claim 26, wherein the adhesive layer is made of a die attach film (DAF) or a thermal interface material (TIM).

28. The method of claim 21, after removing the carrier, further comprising exposing the circuit portion so as to form a plurality of conductive elements on the circuit portion.

29. A fabrication method of a semiconductor package, comprising the steps of:
   providing a semiconductor structure comprising a carrier, a circuit portion formed on the carrier and a plurality of semiconductor chips disposed on the circuit portion;
   providing a lamination member having an insulating layer and disposing the lamination member on the circuit portion through the insulating layer, wherein the insulating layer encapsulates the semiconductor chips, wherein the lamination member is a dummy die; and
   removing the carrier.

30. The method of claim 29, wherein the carrier is a silicon-containing substrate.

31. The method of claim 29, wherein the semiconductor structure further comprises an underfill formed between the circuit portion and the semiconductor chips.

32. The method of claim 29, wherein the insulating layer is further formed between the circuit portion and the semiconductor chips.

33. The method of claim 29, wherein the insulating layer is further formed between the lamination member and the semiconductor chips.

34. The method of claim 29, after removing the carrier, further comprising exposing the circuit portion so as to form a plurality of conductive elements on the circuit portion.

* * * * *